(12) United States Patent
Chua

(10) Patent No.: US 8,669,657 B2
(45) Date of Patent: Mar. 11, 2014

(54) STACKABLE SEMICONDUCTOR ASSEMBLIES AND METHODS OF MANUFACTURING SUCH ASSEMBLIES

(71) Applicant: Micron Technology, Inc., Boise, ID (US)

(72) Inventor: Swee Kwang Chua, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/010,685

(22) Filed: Aug. 27, 2013

(65) Prior Publication Data

US 2014/0008784 A1    Jan. 9, 2014

Related U.S. Application Data

(60) Division of application No. 13/619,409, filed on Sep. 14, 2012, now Pat. No. 8,518,747, which is a division of application No. 12/982,296, filed on Dec. 30, 2010, now Pat. No. 8,288,874, which is a continuation of application No. 12/254,111, filed on Oct. 20, 2008, now Pat. No. 7,863,722.

(51) Int. Cl.
*H01L 23/52* (2006.01)
*H01L 23/48* (2006.01)
*H01L 29/40* (2006.01)

(52) U.S. Cl.
USPC ............... 257/730; 257/E23.104; 257/739; 257/787; 438/107; 438/110

(58) Field of Classification Search
USPC ............ 257/E23.104, E33.006, E21.001, 257/E21.002, E21.499, E21.502, E21.504, 257/E23.001, E23.128, E23.141, 686, 690, 257/678, 723, 730, 739, 787; 438/106, 107, 438/110, 112, 113, 127, 464
See application file for complete search history.

(56) References Cited

U.S. PATENT DOCUMENTS

| | | | |
|---|---|---|---|
| 4,930,216 A | 6/1990 | Nelson | |
| 5,266,833 A | 11/1993 | Capps | |

(Continued)

FOREIGN PATENT DOCUMENTS

| | | |
|---|---|---|
| DE | 102004041889 A1 | 3/2006 |
| DE | 102005003125 A1 | 7/2006 |

(Continued)

OTHER PUBLICATIONS

Furgut, E. et al., "Taking Wafer Level Packaging to the Next Stage: A 200mm Silicon Technology Compatible Embedded Device Technology," Advanced Packaging Conference, SEMICON Europa 2006, Munich, Germany, Apr. 4, 2006.

*Primary Examiner* — Chris Chu
(74) *Attorney, Agent, or Firm* — Perkins Coie LLP

(57) ABSTRACT

Stacked semiconductor devices and assemblies including attached lead frames are disclosed herein. One embodiment of a method of manufacturing a semiconductor assembly includes forming a plurality of first side trenches to a first intermediate depth in a molded portion of a molded wafer having a plurality of dies arranged in rows and columns. The method also includes forming a plurality of lateral contacts at sidewall portions of the trenches and electrically connecting first side bond-sites of the dies with corresponding lateral contacts of the trenches. The method further includes forming a plurality of second side channels to a second intermediate depth in the molded portion such that the channels intersect the trenches. The method also includes singulating and stacking the first and second dies with the channels associated with the first die aligned with channels associated with the second die.

6 Claims, 8 Drawing Sheets

(56) References Cited

U.S. PATENT DOCUMENTS

| | | | |
|---|---|---|---|
| 5,343,075 A | 8/1994 | Nishino | |
| 5,834,162 A | 11/1998 | Malba | |
| 5,888,884 A | 3/1999 | Wojnarowski | |
| 6,320,739 B1 * | 11/2001 | Gotoh et al. | 361/820 |
| 6,351,028 B1 | 2/2002 | Akram | |
| 6,372,623 B1 | 4/2002 | Hoffman et al. | |
| 6,391,685 B1 | 5/2002 | Hikita et al. | |
| 6,412,971 B1 | 7/2002 | Wojnarowski et al. | |
| 6,521,995 B1 | 2/2003 | Akram et al. | |
| 6,528,393 B2 | 3/2003 | Tao | |
| 6,534,726 B1 * | 3/2003 | Okada et al. | 174/263 |
| 6,727,116 B2 * | 4/2004 | Poo et al. | 438/106 |
| 6,730,579 B1 | 5/2004 | Sasaka | |
| 6,753,599 B2 | 6/2004 | Kim | |
| 6,759,745 B2 | 7/2004 | Masumoto et al. | |
| 6,798,665 B2 * | 9/2004 | Kimura | 361/736 |
| 6,818,977 B2 | 11/2004 | Poo et al. | |
| 6,855,572 B2 | 2/2005 | Jeung et al. | |
| 6,881,611 B1 | 4/2005 | Fukasawa et al. | |
| 6,949,407 B2 | 9/2005 | Jeung et al. | |
| 7,012,326 B1 * | 3/2006 | Wu et al. | 257/678 |
| 7,022,552 B2 | 4/2006 | Yamaguchi | |
| 7,045,395 B2 | 5/2006 | Lo et al. | |
| 7,091,062 B2 | 8/2006 | Geyer | |
| 7,115,483 B2 | 10/2006 | Kwon et al. | |
| 7,115,984 B2 | 10/2006 | Poo et al. | |
| 7,126,061 B2 * | 10/2006 | Lin | 174/260 |
| 7,134,198 B2 | 11/2006 | Nakatani et al. | |
| 7,155,815 B2 * | 1/2007 | Gernhardt et al. | 29/825 |
| 7,193,312 B2 | 3/2007 | Boon et al. | |
| 7,199,449 B2 | 4/2007 | Lake | |
| 7,208,335 B2 | 4/2007 | Boon et al. | |
| 7,259,445 B2 | 8/2007 | Lau et al. | |
| 7,298,037 B2 | 11/2007 | Yim et al. | |
| 7,375,009 B2 | 5/2008 | Chua et al. | |
| 7,511,379 B1 | 3/2009 | Flint, Jr. | |
| 7,528,477 B2 * | 5/2009 | Jeung et al. | 257/690 |
| 7,585,750 B2 | 9/2009 | Do et al. | |
| 7,618,903 B2 | 11/2009 | Chae | |
| 7,651,889 B2 | 1/2010 | Tang et al. | |
| 7,659,145 B2 | 2/2010 | Do et al. | |
| 7,667,333 B2 | 2/2010 | Singleton et al. | |
| 7,674,655 B2 | 3/2010 | Chua et al. | |
| 7,687,895 B2 | 3/2010 | Brunnbauer et al. | |
| 7,713,785 B1 | 5/2010 | Flint, Jr. | |
| 7,727,818 B2 | 6/2010 | Hsieh et al. | |
| 7,759,163 B2 | 7/2010 | Kroeninger et al. | |
| 7,915,711 B2 | 3/2011 | Chua et al. | |
| 7,919,717 B2 * | 4/2011 | Braman et al. | 174/262 |
| 7,943,423 B2 | 5/2011 | Pohl et al. | |
| 8,174,107 B2 | 5/2012 | Shinma | |
| 8,183,677 B2 | 5/2012 | Meyer-Berg | |
| 8,193,647 B2 | 6/2012 | Hsieh et al. | |
| 8,358,001 B2 | 1/2013 | Yang et al. | |
| 8,378,466 B2 | 2/2013 | Chiu et al. | |
| 8,390,107 B2 | 3/2013 | Meyer | |
| D680,545 S * | 4/2013 | Nilsson | D14/435 |
| 2002/0139577 A1 | 10/2002 | Miller | |
| 2003/0232488 A1 * | 12/2003 | Chua et al. | 438/460 |
| 2004/0070087 A1 | 4/2004 | Wang et al. | |
| 2004/0183185 A1 | 9/2004 | Badihi | |
| 2004/0221451 A1 | 11/2004 | Chia et al. | |
| 2005/0181540 A1 | 8/2005 | Farnworth et al. | |
| 2005/0269692 A1 | 12/2005 | Kwon et al. | |
| 2006/0197206 A1 | 9/2006 | Kim et al. | |
| 2006/0228825 A1 | 10/2006 | Hembree | |
| 2006/0228832 A1 | 10/2006 | Koh | |
| 2007/0029666 A1 | 2/2007 | Goh et al. | |
| 2007/0126091 A1 | 6/2007 | Wood et al. | |
| 2007/0176275 A1 | 8/2007 | Singleton et al. | |
| 2007/0235851 A1 | 10/2007 | Ware et al. | |
| 2008/0036065 A1 | 2/2008 | Brunnbauer et al. | |
| 2008/0054432 A1 | 3/2008 | Corisis et al. | |
| 2008/0169546 A1 | 7/2008 | Kwon et al. | |
| 2008/0211113 A1 | 9/2008 | Chua et al. | |
| 2008/0224296 A1 | 9/2008 | Meyer et al. | |
| 2009/0230569 A1 * | 9/2009 | Donis et al. | 257/787 |
| 2010/0096737 A1 | 4/2010 | Chua | |
| 2011/0095407 A1 | 4/2011 | Chua | |
| 2011/0175206 A1 | 7/2011 | Kwang et al. | |
| 2013/0011966 A1 | 1/2013 | Chua | |

FOREIGN PATENT DOCUMENTS

| | | |
|---|---|---|
| JP | 11274354 A | 10/1999 |
| KR | 20030032313 A | 4/2003 |

* cited by examiner

STACKABLE SEMICONDUCTOR ASSEMBLIES AND METHODS OF MANUFACTURING SUCH ASSEMBLIES

CROSS-REFERENCE TO RELATED APPLICATIONS

This application is a divisional of U.S. application Ser. No. 13/619,409 filed on Sep. 14, 2012, now U.S. Pat. No. 8,518,747, which is a divisional of U.S. application Ser. No. 12/982,296 filed on Dec. 30, 2010, now U.S. Pat. No. 8,288,874, which is a continuation of U.S. application Ser. No. 12/254,111 filed on Oct. 20, 2008, now U.S. Pat. No. 7,863,722, each of which is incorporated herein by reference in its entirety.

TECHNICAL FIELD

The present disclosure relates to semiconductor devices and assemblies, and methods for manufacturing such devices and assemblies.

BACKGROUND

Semiconductor processing and packaging techniques are continually evolving to meet industry demands for improved performance with reduced size and cost. Electronic products require packaged semiconductor assemblies with a high density of devices in a relatively small space. For example, the space available for memory devices, processors, displays, and other microfeature devices is continually decreasing in personal electronic devices such as cell phones, laptop computers, and many other products. Accordingly, a need exists to decrease the overall size of the microfeature devices while still maintaining or improving performance and reducing cost.

One technique used to improve the performance and reduce the size and cost of these microfeature devices involves wafer level packaging ("WLP"). WLP generally refers to the packaging of microfeature devices at the wafer level, rather than processing and packaging individual devices after dicing them from a wafer. One benefit of WLP is that it creates chip-sized packages having the smallest form factor. WLP achieves these small sizes by limiting components of the package, such as interconnect elements, to be within the footprint or fan-in area of the device. These components are limited within the device footprint because the components are formed at the wafer level before the devices are singulated. WLP also provides the benefit of producing packages having excellent electrical and thermal performance due to the overall reduced size of the package and relatively short length of the interconnects. Additional advantages provided by WLP include the ease of fabrication and reduced assembly cost due to simultaneous or parallel processing and testing at the wafer level. Even though WLP may provide the benefits listed above, it may not be suitable for devices having high pin counts or high input/output requirements. For example, the space limitation of the device footprint restricts the number and pitch of the interconnect elements in the package.

To overcome this problem, the dies can be diced and plated in built-up packages that include interconnects that surround the die and extend through a molded polymer. Although positioning these interconnects outside of the footprint of the die can increase the number and/or pitch of the interconnects, it can significantly increase the cost and complexity of the processing. For example, in certain circumstances the filling process can trap air in vias that can cause the interconnect or package to crack as the fill material and the package harden. Such non-uniformities in the vias provide inconsistent electrical connections and compromise the integrity of the interconnects and performance of the package. Additionally, forming the vias by ablation or drilling processes typically requires forming individual vias in a sequential manner, thus increasing the processing time. Simultaneously forming the vias by an etching process can be much faster, but etching can result in inconsistent via sizes. It can also be difficult to achieve a dense distribution of the vias with an etching process. Moreover, the plating and filling processing steps following the formation of the vias require additional processing time.

DETAILED DESCRIPTION

Figure 1A:
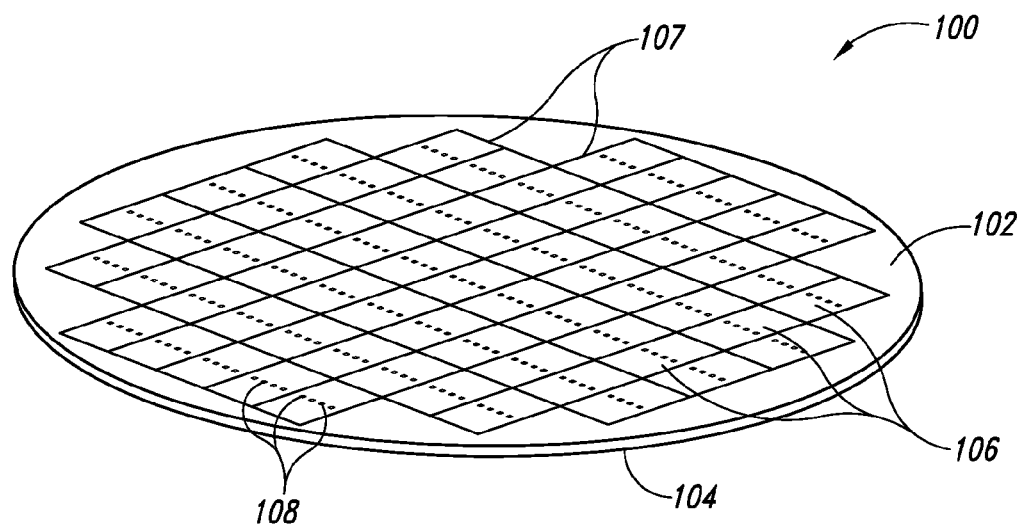
FIG. 1A is an isometric view of a conventional semiconductor wafer before singulation.

Several embodiments of the present disclosure are directed toward packaged semiconductor devices, packaged semiconductor assemblies, and methods of forming such devices and assemblies. Many details of the disclosure are described below with reference to specific structures and methods of forming the devices and assemblies. The terms "semiconductor device" and "semiconductor assembly" are used throughout to include a variety of articles of manufacture including, for example, semiconductor wafers having active components, individual integrated circuit dies, packaged dies, and semiconductor devices or assemblies in a stacked configuration. Many specific details of certain embodiments are set forth in FIGS. 1A-5 and the following text to provide a thorough understanding of these embodiments. Like reference characters refer to like components in FIGS. 1A-5, and thus the description of many of these components will not be repeated with reference to the Figures. Several other embodiments can have different configurations, components or processes than those described in this section. A person skilled in the art will appreciate, therefore, that additional embodiments may exist or that the described embodiments may be practiced without several of the details described below.

FIG. 1A is an isometric view of a conventional semiconductor wafer 100 having a first side 102 opposite a second side 104, and a plurality of semiconductor devices or dies 106. The dies 106 can include, for example, a dynamic or static random access memory, a flash memory, a microprocessor, an imager, or another type of application-specific integrated circuit. Individual dies 106 can include a plurality of bond-sites 108 at the first side 102 to electrically connect the dies 106 with other components. The bond-sites 108 can include a staggered or aligned configuration at the first side 102 of the dies 106. In the illustrated embodiment, the dies 106 are delineated by boundary lines 107, and the dies 106 are processed and built up on the wafer 100 before dicing along the boundary lines 107 to singulate the dies 106.

Figure 1B:
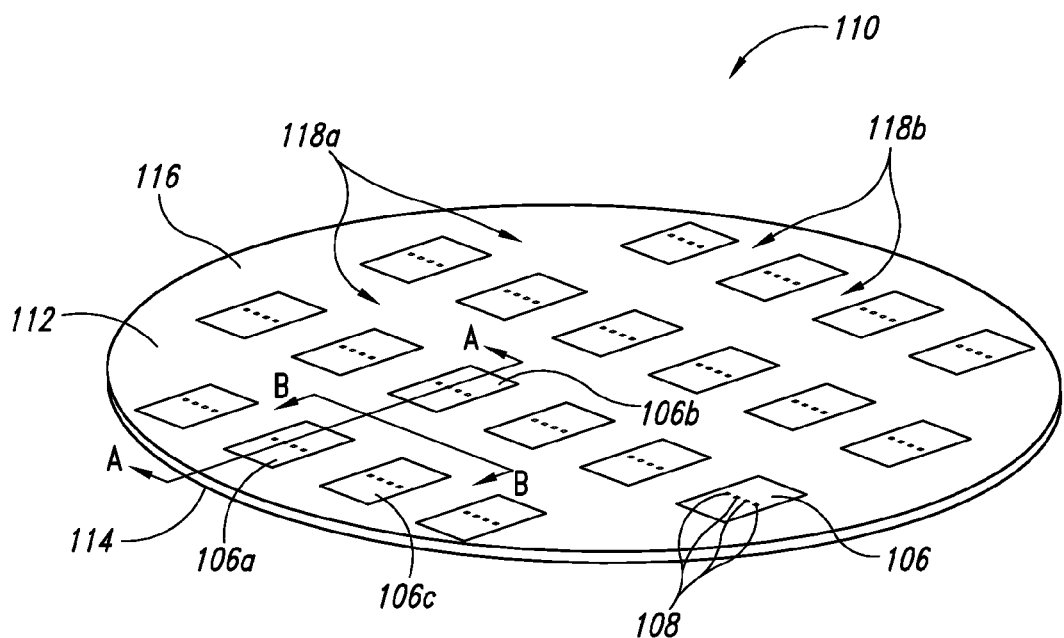
FIG. 1B is an isometric view of a molded wafer configured in accordance with an embodiment of the disclosure.

After singulating the dies 106 from the wafer 100, the dies 106 can be embedded in a mold material configured in a wafer form as illustrated in FIG. 1B. More specifically, FIG. 1B is an isometric view of a molded wafer 110 including a first side 112 opposite a second side 114. The molded wafer 110 is composed of a mold material 116 that can include, for example, polymers, thermosets, thermoplastics, hybridized versions of thermosets and thermoplastics, or other suitable mold materials. The molded wafer 110 also includes the singulated dies 106 (individually identified as a first die 106a, a second die 106b, a third die 106c, etc.). In the illustrated embodiment, the bond-sites 108 are at the first side 112 of the molded wafer 110 and the dies 106 are positioned in a grid-like pattern and spaced apart from one other by lanes in the mold material 116. As illustrated in FIG. 1B, for example, the lanes between the dies can include rows 118a that run in a first direction between the dies 106, and columns 118b that run in a second direction between the dies 106 generally transverse to the rows 118a. One skilled in the art will appreciate that describing the lanes or spacing between the dies as "rows" and "columns" is for the purpose of illustration and does not necessarily require a horizontal or vertical configuration of the rows and columns. The rows 118a and columns 118b in the mold material 116 provide additional space around the dies 106 to form interconnect structures or other components. These interconnect structures are not typically formed between the dies 106 at the wafer 100 level (shown in FIG. 1A) due to cost restrictions of the wafer 100 material. The assemblies and methods described below utilize the molded wafer 110 configuration illustrated in FIG. 1B to form interconnect structures or other features associated with the dies 106.

Figure 2A:
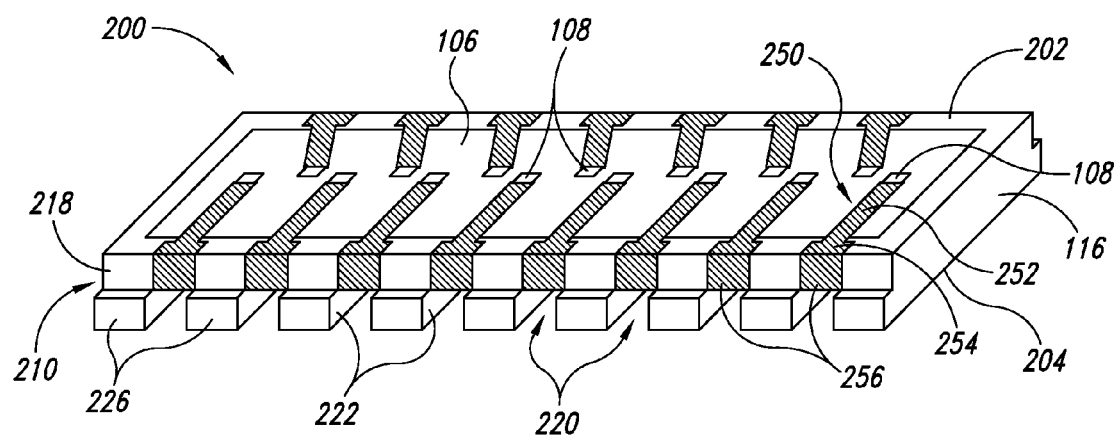
FIG. 2A is a top isometric view and FIG. 2B is a bottom isometric view of a semiconductor assembly configured in accordance with an embodiment of the disclosure.

FIG. 2A illustrates one embodiment of a semiconductor assembly 200 that is processed and singulated from the molded wafer 110. More specifically, FIG. 2A is a top isometric view of the semiconductor assembly 200 including one of the dies 106 embedded in the mold material 116. In the illustrated embodiment, the assembly 200 includes multiple redistribution structures or electrical connectors 250 that extend from each bond-site 108 at a first side 202 of the assembly 200 to a corresponding lateral contact 256 at a sidewall portion 218 of the assembly 200. Each electrical connector 250 can include a redistribution or conductive trace 252 that extends from each bond-site 108 to a corresponding second bond-site 254 positioned at a peripheral edge portion of the assembly 200. In certain embodiments, each second bond-site 254 can be a separate contact that is electrically connected to the corresponding lateral contact 256. In other embodiments, each second bond-site 254 can be integrally formed (e.g., simultaneously deposited) with the corresponding lateral contact 256.

Figure 2B:
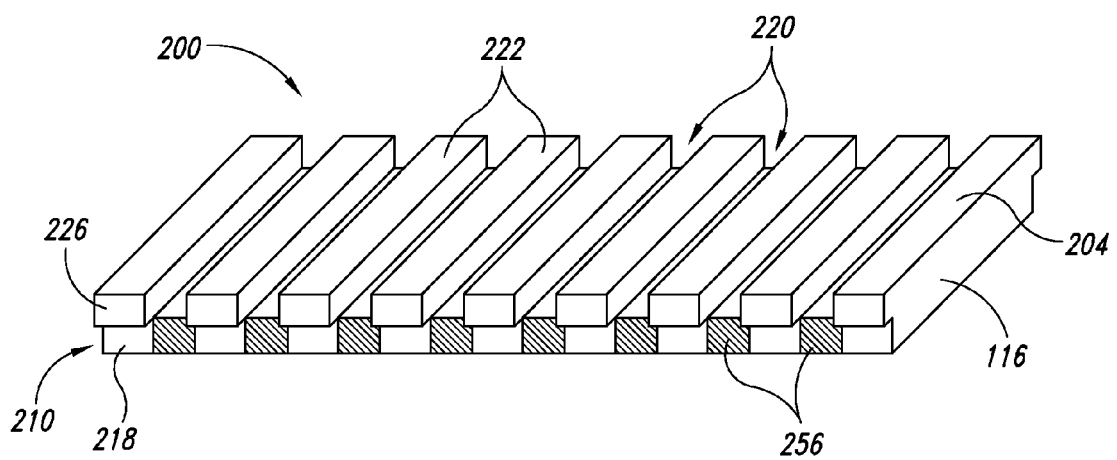

In the illustrated embodiment, the assembly 200 also includes a plurality of channels 220 formed in a second side 204 of the assembly 200 opposite the first side 202. For example, FIG. 2B is a bottom isometric view illustrating the channels 220 in the assembly 200. Referring to FIGS. 2A and 2B together, the channels 220 extend from the second side 204 through a portion of the mold material 116 and form a plurality of spaced apart-ridges 222. In certain embodiments, the ridges 222 can include raised features or heat dissipation fins that extend across the width of the second side 204 between the adjacent channels 220. According to another example of the illustrated embodiment, each ridge 222 includes an extension portion 226 projecting laterally from the sidewall portion 218 of the assembly 200. For example, each extension portion 226 can be a stepped extension of the corresponding ridge 222 from the sidewall portion 218. As explained in detail below with reference to FIGS. 2C-2G, the extension portions 226 can be created by forming the channels 220 in the second side 204 and trenches 210 (only one of which is shown in FIGS. 2A and 2B) in the first side 202 at the sidewall portion 218 of the assembly 200. Moreover, each lateral contact 256 can be disposed at an intersection between the channels 220 and the trenches 210. In this manner, each lateral contact 256 is aligned with the corresponding channel 220.

As explained in detail below, the assembly 200 incorporates the processing benefits from WLP and the reconfigured molded wafer 110 (FIG. 1B) while still providing high quality electrical connections that can be formed with relatively simplified processing steps. For example, rather than ablating, etching, or drilling individual vias, the lateral contacts 256 can be formed at intersections of the first side trenches 210 and corresponding second side channels 220. In addition, in the embodiment shown in FIGS. 2A and 2B, each electrical connector 250 includes the continuous conductive trace 252 extending from the corresponding first bond-site 108 to the corresponding lateral contact 256, which provides a uniform electrical connection without requiring the complex process of forming, plating, and filling the vias associated with conventional interconnects. Moreover, the extension portions 226 protruding from the sidewall portion 218 form a generally castellated side surface that facilitates stacking and interconnection of the assembly 200 with generally similar assemblies.

Figure 2C:
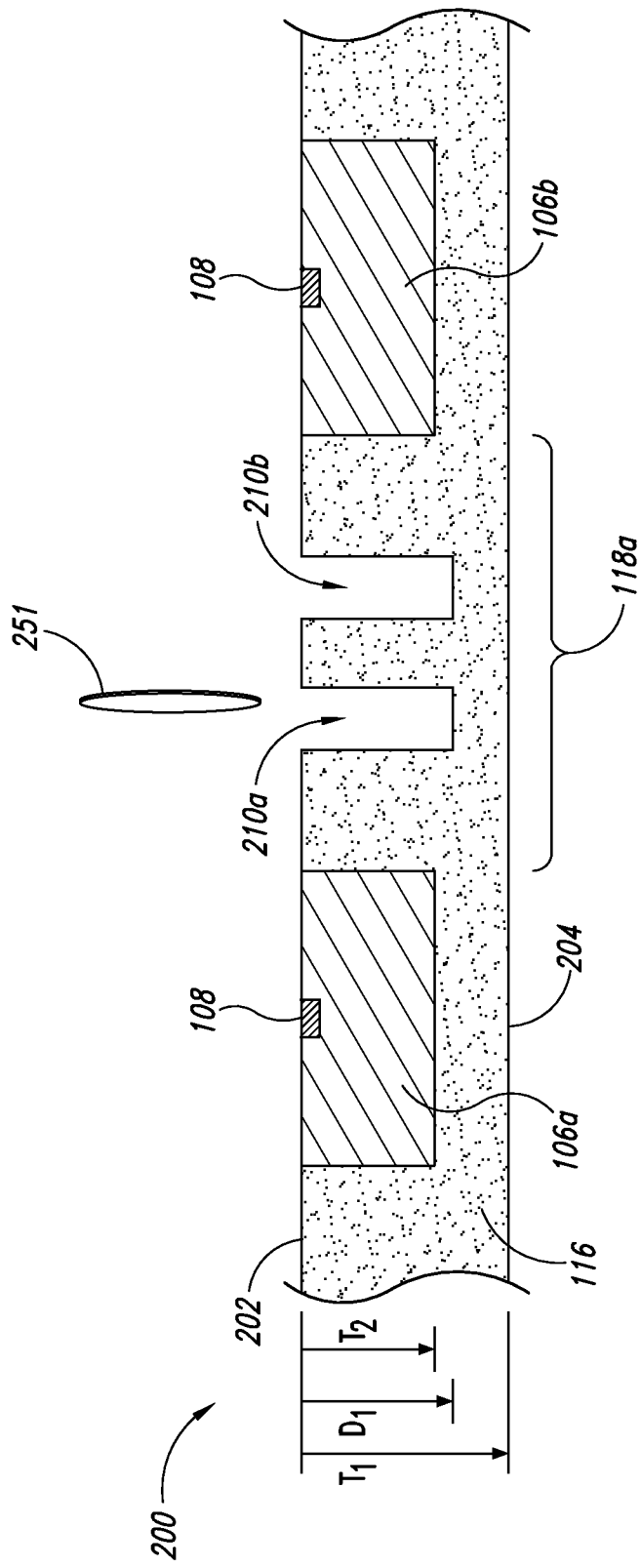
FIG. 2C is a side cross-sectional view.

The individual assembly 200 and electrical connectors 250 have been completely formed in the embodiment illustrated in FIGS. 2A and 2B. FIGS. 2C-2G described below illustrate various techniques and stages in a method of forming the assembly 200 of FIGS. 2A and 2B. For example, FIG. 2C is a cross-sectional view of the assembly 200 along the line A-A of FIG. 1B that illustrates a stage of processing the mold material 116 around the first and second dies 106a-b. At this stage, a portion of the mold material 116 is removed to form one or more trenches 210 (identified individually as a first trench 210a and second trench 210b) in the row 118a between the first and second dies 106a-b. The trenches 210 are formed at the first side 202 and extend to an intermediate depth in the mold material. More specifically, the mold material 116 has a first thickness $T_1$, and each of the dies 106 has a second thickness $T_2$ that is less than the first thickness $T_1$. Each of the first and second trenches 210a-b has a first depth $D_1$ in the mold material 116 that is less than the first thickness $T_1$ of the mold material 116 and equal to or greater than the second thickness $T_2$ of the dies 106. Accordingly, the individual trenches 210 can extend deeper into the mold material 116 than the individual dies 106 without extending through to the second side 204 of the assembly 200.

In certain embodiments, forming the trenches 210 can include partially dicing the mold material 116 with a cutting device 251, such as a wafer saw, blade, laser, fluid jet, etchant, or other tool suitable for removing controlled portions of the mold material 116. For example, to form the first and second trenches 210a-b, two spaced-apart cutting devices 251 (only one of which is shown in FIG. 2C) can remove the corresponding mold material 116 in a single pass in the row 118a. In other embodiments, a single cutting device 251 can remove the mold material 116 by making multiple passes and repositioning the cutting device and/or the wafer between passes. Moreover, in certain embodiments a single trench 210 (rather than first and second trenches 210a-b) can be formed in the row 118a having a width generally the same as the width between the outer walls of the first and second trenches 210a-b. In addition, although the trenches 210 illustrated in FIG. 2C have a generally rectilinear cross-sectional shape, one skilled in the art will appreciate that that the trenches 210 can include other shapes including, but not limited to, curved sidewalls, smooth transitions between the sidewalls and bottoms of the trenches 210, etc.

Figure 2D:
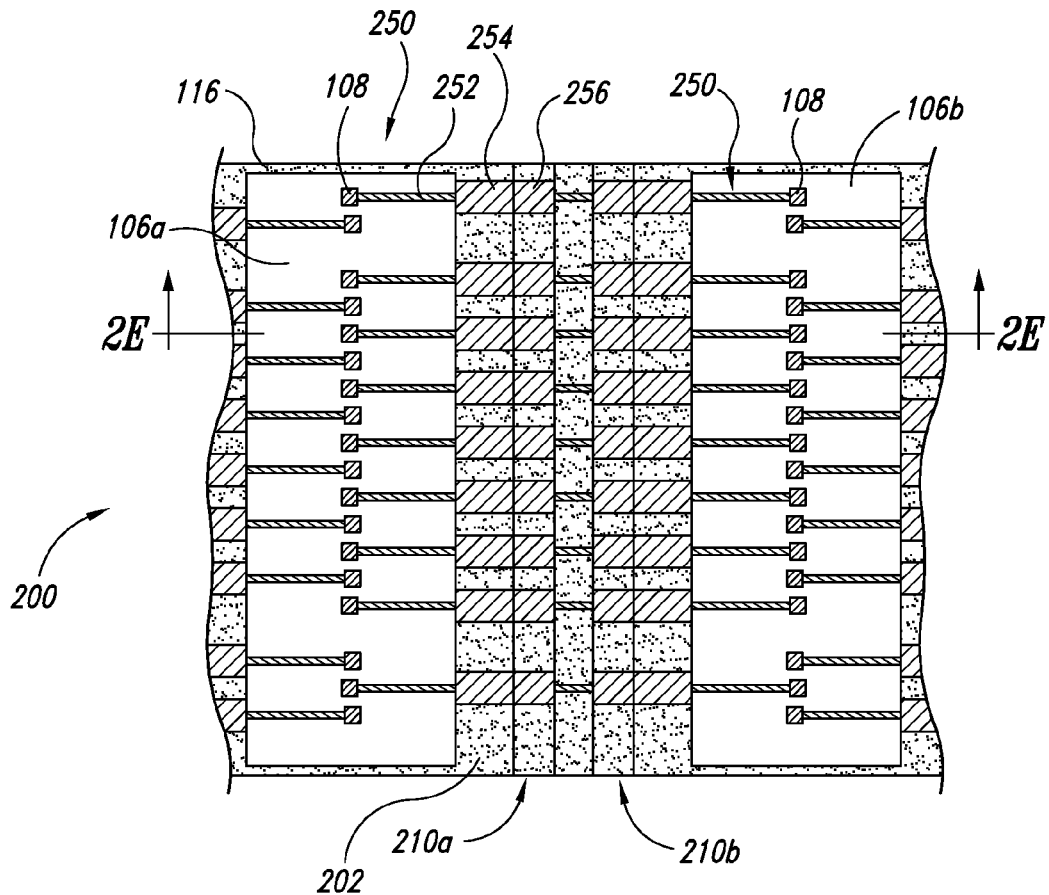
FIG. 2D is a top partial view.
Figure 2E:
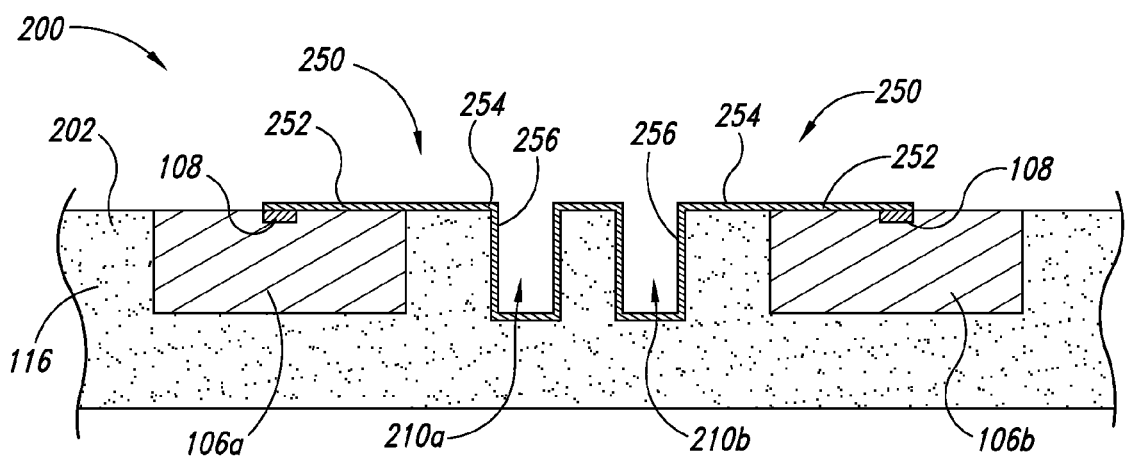
FIGS. 2E-2G are side cross-sectional views illustrating various stages in a method of manufacturing a semiconductor assembly configured in accordance with an embodiment of the disclosure.

FIG. 2D illustrates a stage after forming the trenches 210 in the first side 202 in which conductive material is selectively applied to form the redistribution structures or electrical connectors 250. FIG. 2E is a side cross-sectional view taken along the line 2E-2E of FIG. 2D. Referring to FIGS. 2D and 2E together, at this stage of the processing the sidewalls of the trenches 210 can be plated with conductive material to form the lateral contacts 256 in the trenches 210. In certain embodiments, the second bond-sites 254 can be plated and integrally formed with the lateral contacts 256. In other embodiments, however, each second bond-site 254 can be separately deposited and then electrically connected to the corresponding lateral contact 256. Moreover, the conductive trace 252 can also be deposited to electrically connect each first bond-site 108 to the corresponding second bond-site 254 and lateral contact 256. In certain embodiments, for example, the conductive trace 252 can be deposited or otherwise formed at the processing stage illustrated in FIGS. 2D and 2E. In other embodiments, however, the conductive trace 252 can be formed at the semiconductor wafer prior to singulation (e.g., FIG. 1A).

Figure 2F:
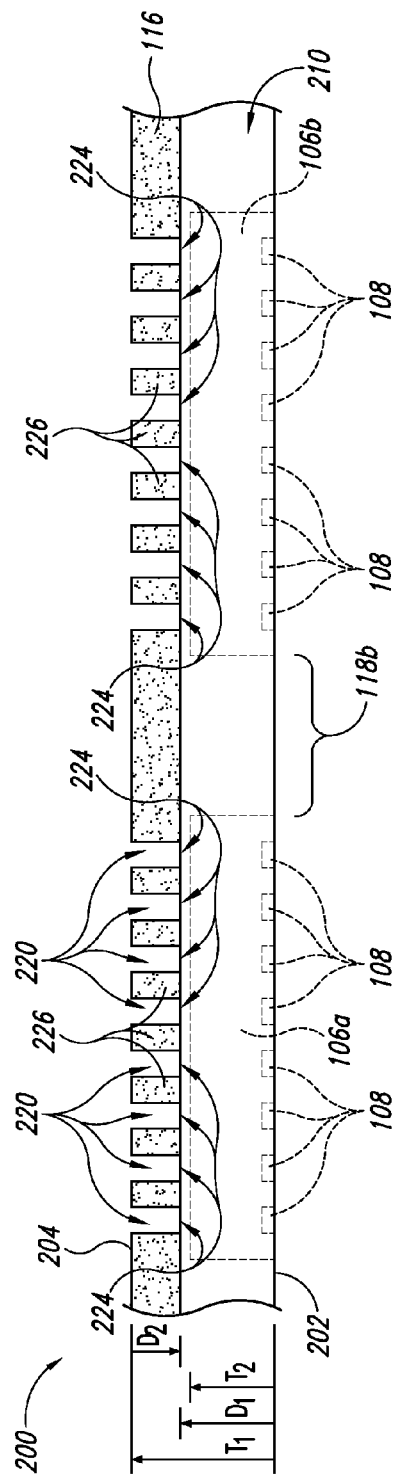

FIG. 2F illustrates a stage after forming the trenches 210 and electrical connectors 250 at the first side 202, and in which the mold material 116 is selectively removed from the second side 204 to form the channels 220. More specifically, FIG. 2F is a side cross-sectional view of the assembly 200 along the line B-B of FIG. 1B. For purposes of illustration, the assembly 200 shown in FIG. 2C is inverted so that the second side 204 is facing up. In addition, the dies 106 and the bond-sites 108 are out of the plane of FIG. 2C and shown in broken lines for reference. In this configuration, multiple second side channels 220 are formed in a direction generally transverse to the trenches 210 described above (only one trench 210 is shown in FIG. 2F). The channels 220 can be formed in a manner similar to that described above with reference to the trenches 210. In certain embodiments the channels 220 can be generally similar to the trenches 210 and are called channels rather than trenches for purposes of clarity in distinguishing between the two.

In the embodiment illustrated in FIG. 2F, the channels 220 are not formed in the column 118b between the first and second dies 106a-b, but rather at a preselected pitch within the footprint of the individual dies 106. In other embodiments, the channels 220 can be formed at any preselected location at the second side 204, including, for example, within the column 118b. The channels 220 have a second depth $D_2$ into the mold material 116 from the second side 204 that does not intersect the dies 106. The combination of the first depth $D_1$ of the trenches 210 and the second depth $D_2$ of the channels 220, however, is equal to or greater than the first thickness $T_1$ of the mold material 116. Accordingly, the intersections between the first side trenches 210 and the second side channels 220 form a plurality of openings 224 through the mold material 116.

The configuration and method of forming the openings 224 described above provide a relatively fast and cost-effective method of forming the openings 224 through the mold material 116. For example, cutting a single second side channel 220 after forming the first side trenches 210 creates multiple openings 224 at the intersections with only a single pass through the mold material 116. In addition, removing the mold material 116 in the trenches 210 and channels 220 uses existing methods and avoids some of the challenges associated with conventional via techniques. For example, drilling with a laser can create non-uniform vias having an entry diameter that is larger than an exit diameter. Another challenge associated with drilling a via includes unwanted melted and resolidified mold material that can remain at the entry side of the via. Moreover, adequately plating and filling a via having a small aspect ratio formed by drilling techniques can also provide a significant challenge.

Figure 2G:
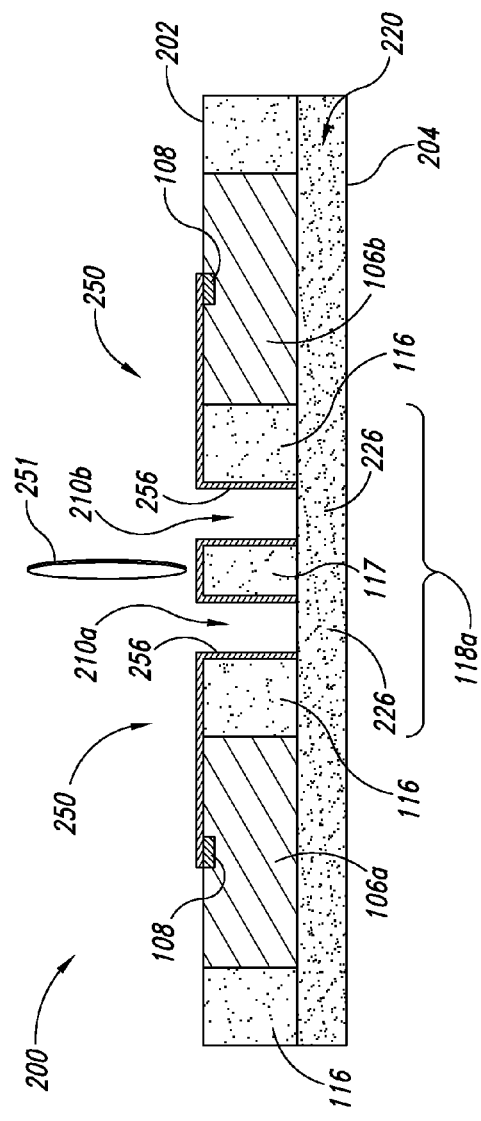

Referring to FIG. 2G, the next processing step includes singulating the first and second dies 106a-b and associated components from the molded wafer 110 (FIG. 1B). The assemblies 200 can be singulated, for example, by cutting the mold material 116 FIG. 1B along the rows 118a and columns 118b between the individual dies 106 (FIG. 1B). More specifically, FIG. 2G is a side cross-sectional view along the line A-A of FIG. 1B. In the illustrated embodiment, the assemblies 200 can be singulated to expose the lateral contacts 256 at a peripheral edge portion of the mold material 116. The cutting device 251 can singulate the assemblies 200 and remove a section 117 between the first and second trenches 210a-b to separate the first die 106a from the second die 106b. Moreover, removing the section 117 in the row 118a between the first and second trenches 210a-b forms the extension portions 226 extending laterally from each assembly 200 (see, e.g., FIG. 2A). Exposing the lateral contacts 256 at the sides of the assembly 200 provides locations to electrically connect to in a later stage of the processing.

Figure 3A:
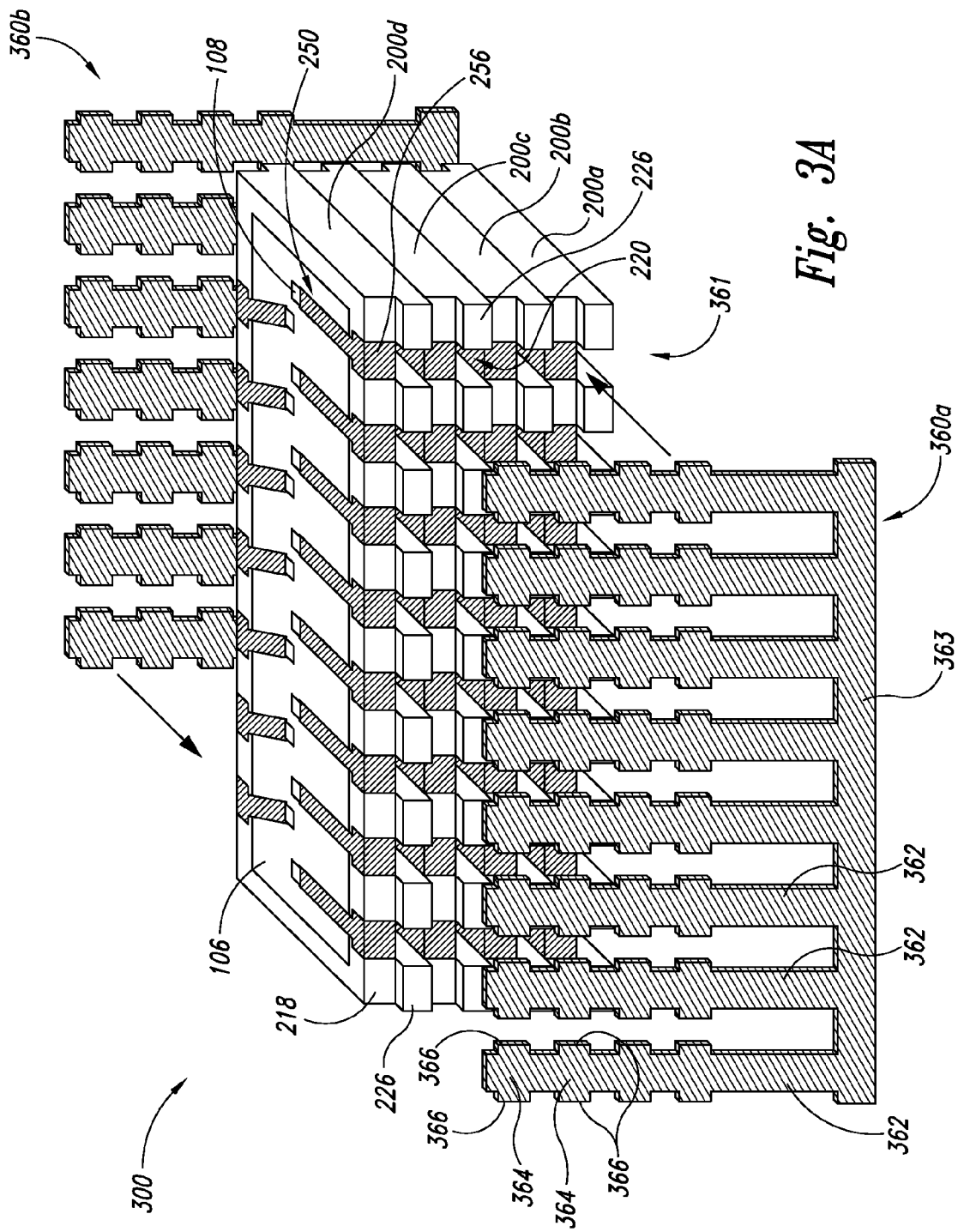
FIG. 3A is a top isometric view illustrating a stage in a method of manufacturing a semiconductor device assembly configured in accordance with an embodiment of the disclosure.

After the individual assemblies 200 have been formed and singulated as described above with reference to FIGS. 1A-2G, they can be assembled together in a stacked configuration. FIG. 3A, for example, is an isometric top view illustrating a step in the process of forming a stacked semiconductor assembly 300 configured in accordance with an embodiment of the disclosure. In the illustrated embodiment, the stacked assembly 300 includes multiple assemblies 200 (identified individually as first through fourth assemblies 200a-d) stacked on one other. In the stacked configuration, the channels 220 of each individual assembly 200 extend through the width of the stacked assembly 300. When stacking the assemblies 200, the channels 220 in each assembly 200 can be aligned with the corresponding channels 220 in the adjacent assemblies 200. Moreover, the lateral contacts 256 of each assembly 200 are also aligned with the corresponding lateral contacts 256 of the adjacent assemblies 200. In addition, the extension portions 226 of each assembly 200 also protrude from a sidewall 361 of the stacked assembly 300, thereby forming a grid-like or castellated surface of the sidewall 361. In this manner, the lateral contacts 256 are externally accessible as well as aligned and spaced apart from one other at the sidewall 361. Moreover, as explained below, the extension portions 226 form a castellated side surface and act as alignment features at the castellated surface of the sidewall 361.

As shown in the embodiment illustrated in FIG. 3A, the stacked assembly 300 further includes grated lead frames 360 (identified individually as a first lead frame 360a and a second lead frame 360b), each of which is configured to be attached to one of the castellated sidewalls 361 of the stacked assembly 300. Each of the lead frames 360 can be a conductive grid including a plurality of conductors or lead fingers 362 extending from a stabilizing portion 363. In certain embodiments, each lead finger 362 can be an elongated conductive bar. Each lead finger 362 includes multiple contacts or attachment portions 364 positioned between alignment portions 366. The attachment portions 364 are spaced apart along a longitudinal axis of each lead finger 362. The alignment portions 366 extend laterally from the attachment portions 364 of each lead finger 362. The attachment portions 364 (as well as the alignment portions 366) are spaced apart from one another along each lead finger 362 at a pitch matching that of the spaced-apart lateral contacts 256 at the castellated sidewall 361. In certain embodiments, the lead frames 360 are made from metallic materials and can be coated with conductive materials, such as tin, solder, or other suitable conductive materials, that can be reflowed to connect the lead frames 360 to the sidewalls 361 of the stacked assembly 300. In other embodiments, however, reflowable conductive material can be deposited on the attachment portions 364 or on the lateral contacts 256.

Figure 3B:
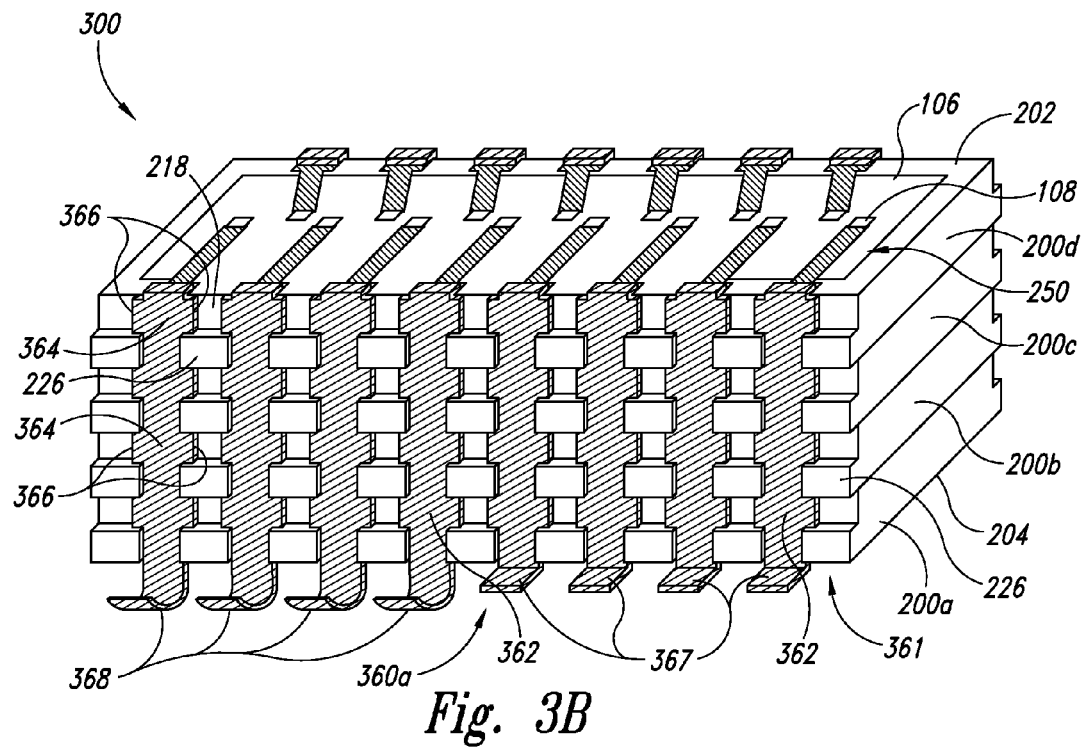
FIG. 3B is a top isometric view and FIG. 3C is a bottom isometric view of a semiconductor assembly configured in accordance with an embodiment of the disclosure.

To attach the lead frames 360 to the stacked assembly 300, the attachment portions 364 of the lead frames 360 are aligned with the lateral contacts 256 at the sidewall 361, and conductive material carried by the lead frame 360 can be reflowed to establish a connection between the lead finger attachment portions 364 and the lateral contacts 256 at the sidewall 361. FIG. 3B, for example, is a top isometric view of the stacked assembly 300 after the first lead frame 360a has been attached to the sidewall 361. As shown in the illustrated embodiment, the alignment portions 366 of each lead finger 362 engage the corresponding extension portions 226 and align the first lead frame 360a at the sidewall 361 with the corresponding extension portions 226.

After each lead frame 360 is attached to the sidewall 361 of the stacked assembly 300, the stabilizing portion 363 of the lead frame 360 can be removed to electrically isolate the individual lead fingers 362. As shown in FIG. 3B, for example, the stabilizing portion 363 has been removed after attaching the lead fingers 362 to the sidewall 361 of the stacked assembly 300. Moreover, removing the stabilizing portion 363 can form external contacts for each lead frame 360 at the end portions of each lead finger 362. For purposes of illustration, FIG. 3B illustrates different external contacts in the same assembly 300. As shown towards the right side of FIG. 3B, for example, each lead finger 362 can include a generally planar external contact 367 (e.g., a gull-wing lead). In other embodiments and as shown towards the left side of FIG. 3B, each lead finger 362 can include a curved external contact 368 (e.g., a J-lead). In still further embodiments, the end portions of the lead fingers 362 can include other suitable types of external contacts.

Figure 3C:
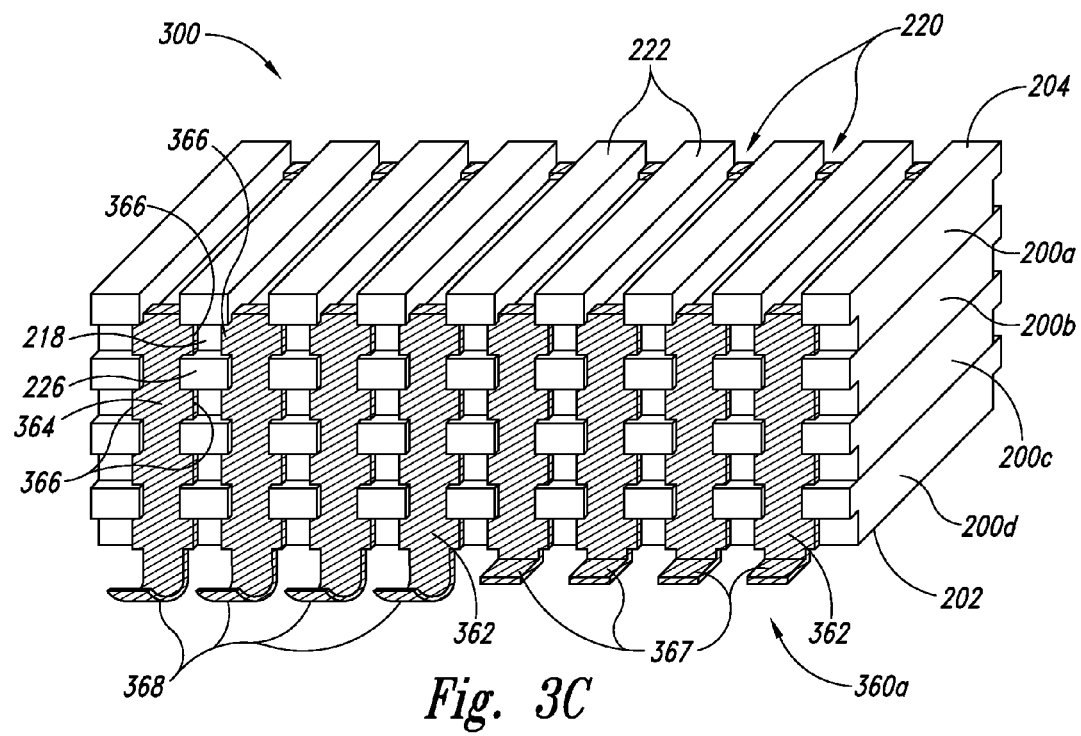

FIG. 3C illustrates another embodiment of the stacked assembly 300. More specifically, FIG. 3C is a bottom isometric view of the stacked assembly 300. In this embodiment, however, the assemblies 200 are inverted so that the channels 220 and ridges 222 are facing up. Moreover, the lead frames 360 are attached to the inverted assemblies 200 at the castellated sides of the assemblies 200 with the external contacts 367 and 368 of the lead fingers 362 facing towards the bottom of the stacked assembly 300. Accordingly, in the illustrated embodiment the ridges 222 of the first assembly 200a can act as heat transfer features for heat dissipation from the stacked assembly 300.

Figure 4:
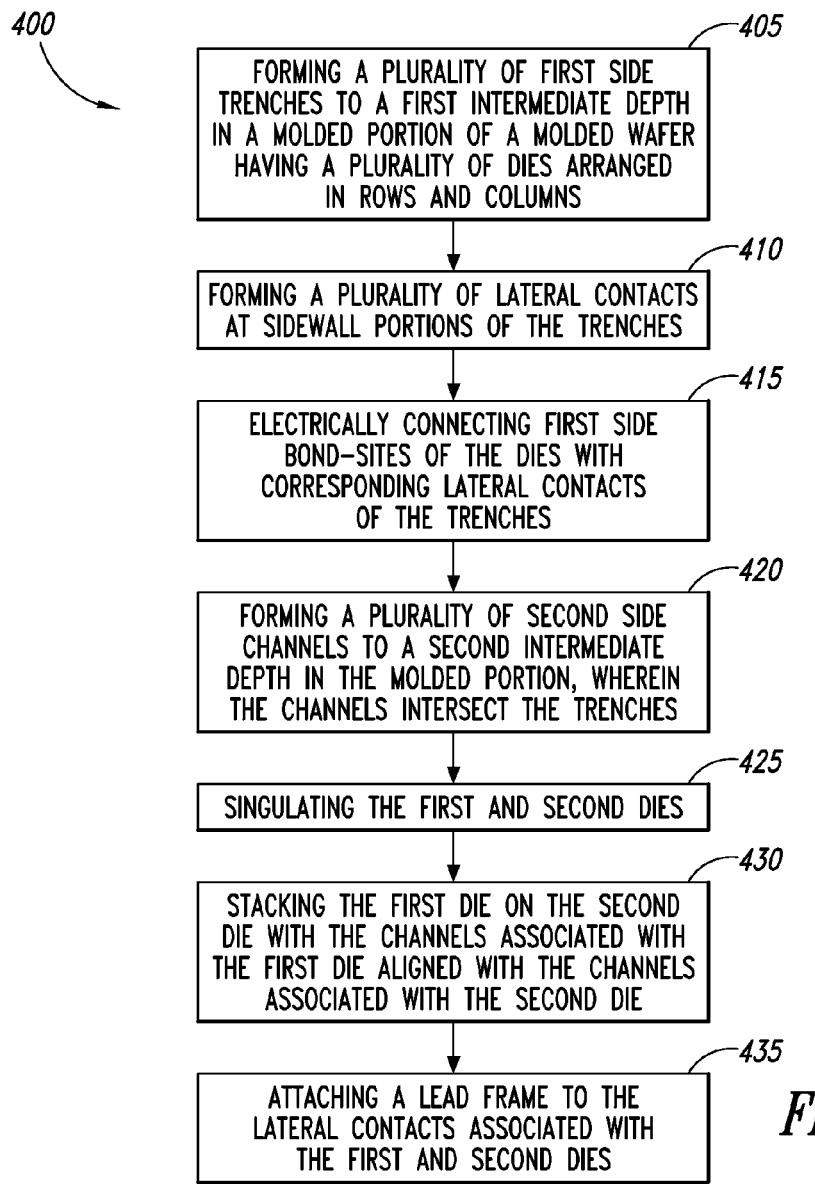
FIG. 4 is a flow diagram of a process of manufacturing a semiconductor assembly configured in accordance with another embodiment of the disclosure.

FIG. 4 is a flow diagram of an embodiment of a method or process 400 for forming a semiconductor assembly. In this embodiment, the process 400 includes forming a plurality of first side trenches to a first intermediate depth in a molded portion of a molded wafer having a plurality of dies arranged in rows and columns (block 405). In certain embodiments, this step can include forming a single trench in each row or column between the dies. In other embodiments, however, this step can include forming two or more parallel and spaced-apart trenches in each row or column between the dies.

The process further includes forming a plurality of lateral contacts at sidewall portions of the trenches (block 410) and electrically connecting the first side bond-sites of the dies with corresponding lateral contacts of the trenches (block 415). In certain embodiments, these steps can include forming redistribution structures forming an electrical connection between the bond-sites of the dies and the corresponding lateral contacts. For example, these steps can include disposing discrete amounts of conductive material between the bond-sites and the corresponding lateral contacts. The process further includes forming a plurality of second side channels to a second intermediate depth in the molded portion such that the channels intersect the trenches (block 420). In certain embodiments, the second side channels can be generally transverse to the first side trenches. The combination of the depths of the first side trenches and second side channels is greater than the thickness of the mold material of the molded wafer.

The process further includes singulating the first and second dies (block 425). In certain embodiments, singulating the first and second dies includes exposes the lateral contacts at an outer periphery of the mold material surrounding the first and second dies. Moreover, singulating the first and second dies can include cutting the mold material in the trenches and forming extension portions protruding laterally from the mold material surrounding the first and second dies. In certain embodiments the extension portions create a castellated edge portion of the mold material around the dies. The process further includes stacking the first die on the second die (block 430). In certain embodiments, stacking the first die on the second die includes aligning the channels associated with the first die with the channels associated with the second die. The process can also include attaching a lead frame to the lateral contacts associated with the first and second dies (block 435). In certain embodiments, the lead frame includes multiple lead fingers having attachment portions spaced apart along a longitudinal axis of each lead finger. Individual lead fingers can also include alignment portions extending laterally from each attachment portion. As such, in certain embodiments, attaching the lead frame can include attaching individual attachment portions of the lead fingers with corresponding lateral contacts and engaging the alignment portions of the lead fingers with corresponding extension portions protruding from the mold material surrounding the stacked first and second dies.

Figure 5:
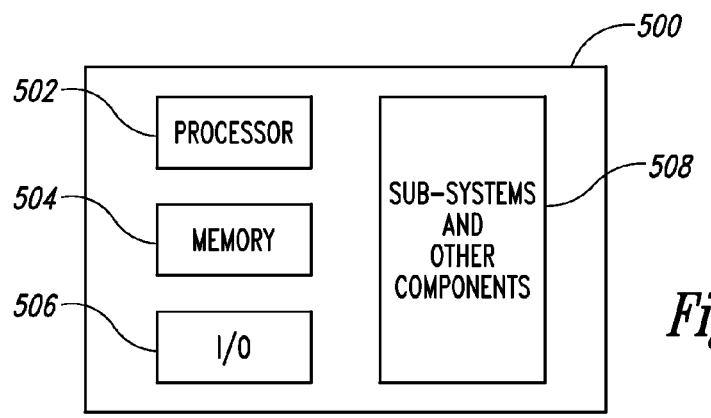
FIG. 5 is a schematic view of a system that incorporates semiconductor assemblies configured in accordance with further embodiments of the disclosure.

Any one of the assemblies having the features described above with reference to FIGS. 1A-4 can be incorporated into any of a myriad of larger and/or more complex systems, a representative example of which is system 500 shown schematically in FIG. 5. The system 500 can include a processor 502, a memory 504 (e.g., SRAM, DRAM, flash, and/or other memory devices), input/output devices 506, and/or other subsystems or components 508. The assemblies having electrical connectors described above with reference to FIGS. 1A-4 may be included in any of the components shown in FIG. 5. The resulting system 500 can perform any of a wide variety of computing, processing, storage, sensing, imaging, and/or other functions. Accordingly, representative systems 500 include, without limitation, computers and/or other data processors, for example, desktop computers, laptop computers, Internet appliances, hand-held devices (e.g., palm-top computers, wearable computers, cellular or mobile phones, personal digital assistants, music players, etc.), multi-processor systems, processor-based or programmable consumer electronics, network computers, and minicomputers. Other representative systems 500 may be housed in a single unit or distributed over multiple interconnected units (e.g., through a communication network). The components of the system 500 can accordingly include local and/or remote memory storage devices and any of a wide variety of computer-readable media.

From the foregoing it will be appreciated that specific embodiments have been described herein for purposes of illustration, but that various modifications may be made without deviating from the disclosure. For example, one of the stacked assemblies described above may be combined with another generally similar stacked assembly. Where the context permits, singular or plural terms may also include the plural or singular terms, respectively. Moreover, unless the word "or" is expressly limited to mean only a single term exclusive from the other items in reference to a list or two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature or additional types of features are not precluded.

Various modifications may be made without deviating from the embodiments disclosed herein. For example, features described in the context of particular embodiments may be combined or eliminated in other embodiments. Further, although advantages associated with certain embodiments have been described in the context of those embodiments, other embodiments may also exhibit such advantages, and not all embodiments need necessarily exhibit such advantages to fall within the scope of the disclosure. For example, trenches or channels of varying widths and depths can be formed in the mold material. Accordingly, the disclosure is not limited except as by the appended claims.

I claim:

1. An intermediate article of manufacture comprising:
    a mold material having a first side opposite a second side, and a lateral side between the first and second sides;
    a first bond-site at the first side of the mold material;
    a second bond-site at the lateral side of the mold material, wherein the second bond-site is electrically coupled to the first bond-site;
    a first ridge extending across at least a portion of the second side of the mold material, the first ridge having a first extension portion protruding from the lateral side; and
    a second ridge spaced apart from the first ridge and extending across at least a portion of the second side of the mold material, the second ridge having a second extension portion spaced apart from the first extension portion and protruding from the lateral side, wherein the second bond-site is aligned between the first and second extension portions.

2. The article of claim 1 wherein the first and second ridges are spaced apart from each other by a channel extending through at least a portion of the second side of the mold material, wherein the channel is generally aligned with the second bond-site.

3. The article of claim 1 wherein the channel is a first channel and the first and second ridges are a first set of ridges, and wherein the article further comprises a plurality of alternating channels and ridges extending across at least a portion of the second side of the mold material.

4. The article of claim 1 wherein the second bond-site extends over at least a portion of the first side of the mold material.

5. The article of claim 1, further comprising:
    a plurality of first bond-sites at the first side of the mold material coupled to a plurality of corresponding second bond-sites at the lateral side of the mold material; and
    a plurality of spaced apart ridges extending across at least a portion of the second side of the mold material, the individual ridges having extension portions protruding from the lateral side, wherein individual second bond-sites are aligned between adjacent corresponding extension portions.

6. The article of claim 1, further comprising a die at least partially embedded in the mold material, wherein the die carries the first bond-site.

* * * * *